United States Patent [19]

Park

[11] Patent Number: 6,015,631

[45] Date of Patent: Jan. 18, 2000

[54] LUMINESCENT COMPOUND FOR AN ELECTROLUMINESCENCE DISPLAY DEVICE

[75] Inventor: Jong Wook Park, Kyungki-do, Rep. of Korea

[73] Assignee: Samsung Display Devices Co., Ltd., Kyungki-do, Rep. of Korea

[21] Appl. No.: 08/944,320

[22] Filed: Oct. 6, 1997

[30] Foreign Application Priority Data

Oct. 7, 1996 [KR] Rep. of Korea ................ 96-44370

[51] Int. Cl.[7] ....................................... B32B 9/00
[52] U.S. Cl. .......................... 428/690; 313/504; 313/506; 428/457; 428/917; 528/172; 528/199; 528/202; 528/327
[58] Field of Search ...................... 528/202, 172, 528/199, 327; 428/457, 690, 917; 313/504, 506

[56] References Cited

U.S. PATENT DOCUMENTS 5,674,635  10/1997  Hsieh et al. .................... 428/690
5,759,709   6/1998  Doi et al. ...................... 313/504

*Primary Examiner*—John M. Cooney, Jr.
*Attorney, Agent, or Firm*—Christie, Parker & Hale, LLP

[57] ABSTRACT

An organic polymer compound is synthesized by introducing an electron donor and an electron acceptor into a main polymer chain through chemical bonds in the mixing system at a molecular level. An electroluminescence display device (ELD) which has low driving voltage, various colors and rapid responsive speed is produced by using the organic polymer compound as a luminescent material.

The luminescent compound for an electroluminescence display device (ELD) is used as an electroluminescent material of a light emitting diode (LED) and an ELD in a flat panel display and applied to organic material devices field because of low driving voltage, various colors, rapid responsive speed and film processibility.

8 Claims, 1 Drawing Sheet

LUMINESCENT COMPOUND FOR AN ELECTROLUMINESCENCE DISPLAY DEVICE

BACKGROUND OF THE INVENTION

1. FIELD OF THE INVENTION

The present invention relates to an electroluminescence display device. In particular the present invention relates to luminescent compounds for an electroluminescence display device (ELD) which can be used in a light emitting diode (LED) as well as an ELD for the next generation technology and which have low driving voltage, various colors and rapid responsive speed, and which can also be applied to the fields of organic material devices for film processibility.

2. DESCRIPTION OF THE RELATED ARTS

Recently, as the progress in information and communication industries accelerates, the most important field thereof, the display device field, requires a high performance for display devices. These display devices can be divided into luminescence type and non-luminescence type. The luminescence type display devices include cathode ray tubes (CRT), electroluminescence displays (ELD), light emitting diodes (LED), and plasma display panels (PDP). The non-luminescence type display devices include liquid crystal displays (LCD) and so forth.

The luminescence type and non-luminescence type display devices have the basic functions such as driving voltage, consumption power, brightness, contrast, responsive speed, durability, display color, etc.

However, presently the most commonly utilized LCD has the problems of responsive speed, contrast and vision angle dependency among these functions. In these circumstances, the display with an emitting diode is expected to be the display device for the next generation in which the problems of LCD are solved.

Meanwhile, since inorganic materials of a crystal type are mainly used in the emitting diode, it is difficult for the emitting diode to be applied to ELDs with a large area. In addition, the colorization problems complicate the process, since a large amount of power is necessary for ELD and most of luminescent colors thereof are yellow centered.

SUMMARY OF THE INVENTION

The present invention is intended to overcome the above described disadvantages of the conventional art and the object of the invention is to provide an ELD with a large area and color.

The present invention provides a luminescent compound for an electroluminescence display device (ELD) comprising a main polymer chain, a component having an electron-donating group attached to the main polymer chain, and a component having an electron-accepting group attached to the main polymer chain. Preferably an aromatic amine moiety and a cyano moiety are conjugated in the luminescent compound for an ELD.

The luminescent compound for an ELD preferably has the following chemical formula 1,

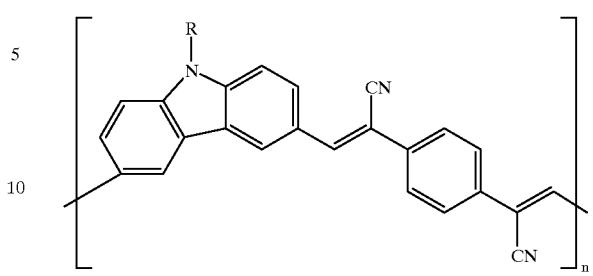

(1)

wherein, R is $C_1$–$C_{24}$ alkyl groups.

The present invention also provides a method of synthesizing poly 3,6-N-alkyl carbazolyl cyanoterephthalidene comprising the steps of producing N-alkylcarbazole, producing N-alkyl-3,6-diformylcarbazole by reacting the N-alkylcarbazole with phosphorous oxychloride/dimethyl formamide/dichloroethane and reacting the N-alkyl-3,6-diformylcarbazole with the solution system containing 1,4-phenylene diacetonitrile followed by alcohol precipitation, filtration and drying.

Our preferred method of producing N-alkyl carbazole comprises refluxing potassium carbonate, dimethyl formamide, carbazole and alkyl halides for 1 to 2 days, with the alkyl halides selected from the group consisting of halides of methane, ethane, propane, butane, pentane, hexane, heptane, octane, 2-ethyl hexane, nonane, decane, undecane, dodecane, tridecane, tetradecane, pentadecane, hexadecane, octadecane, docosane and tetracosane.

Another preferred method of producing N-alkyl carbazole comprises refluxing carbazole and alkyl halides in the presence of sodium hydride and dimethyl formamide or 1,4-dioxane/tetrahydrofuran for 8 to 48 hours, with the alkyl halides selected from the group consisting of halides of methane, ethane, propane, butane, pentane, hexane, heptane, octane, 2-ethyl hexane, nonane, decane, undecane, dodecane, tridecane, tetradecane, pentadecane, hexadecane, octadecane, docosane and tetracosane.

Still another preferred method of producing N-alkyl carbazole comprises refluxing carbazole and alkyl halides in the presence of sodium hydroxide or potassium hydroxide and 1,4-dioxane/tetrahydrofuran for 12 to 48 hours, with the alkyl halides selected from the group consisting of halides of methane, ethane, propane, butane, pentane, hexane, heptane, octane, 2-ethyl hexane, nonane, decane, undecane, dodecane, tridecane, tetradecane, pentadecane, hexadecane, octadecane, docosane and tetracosane.

Yet another preferred method of producing N-alkyl carbazole comprises mixing sodium hydroxide or potassium hydroxide and water, with a weight ratio of sodium hydroxide or potassium hydroxide to water of 1:1, and refluxing carbazole and alkyl halides in the presence of phase transition catalyst for 1 to 2 days, with the alkyl halides selected from the group consisting of halides of methane, ethane, propane, butane, pentane, hexane, heptane, octane, 2-ethyl hexane, nonane, decane, undecane, dodecane, tridecane, tetradecane, pentadecane, hexadecane, octadecane, docosane and tetracosane.

The solution containing 1,4-phenylene diacetonitrile preferably is selected from the group consisting of tetra(n-butyl) ammonium hydroxide, 1,4-phenylene diacetonitrile/tetra (n-butyl)ammonium hydroxide/ethanol/tetrahydrofuran, 1,4-phenylene diacetonitrile/tetra (n-butyl) ammonium hydroxide/tetrahydrofuran, and potassium t-butoxide/tetrahydrofuran.

The ELD using organic materials can overcome the defects of ELD's using inorganic materials due to low driving voltage, production of various colors from blue color to red color, rapid responsive speed, and especially excellent processibility.

The present invention provides a main polymer chain to which an electron donor and an electron acceptor are bonded and introduced organic polymer whose luminescent color is blue, the most difficult color, through chemical bonds in a mixed system of molecular level.

The organic polymer emits a blue color when its molecular weight is low and a green color when its molecular weight is high.

The compound according to the present invention is incorporated between the cathode prepared by injecting holes comprising indium tin oxide (ITO) with large work function and the anode prepared by injecting electron comprising metals with various work function such as Al, Cu, Ag, Ca, In, Au, Mg, the alloy of Mg/Ag and the alloy of Al/Li. The compound is caused to emit light by applying an electric field to both the cathode and the anode.

DETAILED DESCRIPTION OF THE PREFERRED EMBODIMENTS

Although the invention has been described with reference to a preferred embodiment, it is to be understood that the invention is not limited to the preferred embodiment as herein described.

EXAMPLE 1

The poly 3,6-N-alkyl carbazolyl cyanoterephthalidene was synthesized by the following process.

The mixture containing potassium carbonate, dimethyl formamide, carbazole and alkyl halide of 2-ethylhexyl bromide was refluxed for 1 to 2 days. The resultant solution was poured into excess water, extracted with an organic solvent such as chloroform, dichloromethane or ethylacetate, and dried. The N-alkyl carbazole thus obtained was reacted in the presence of phosphorus oxychloride/dimethyl formamide/dichloroethane at 90–100° C. for 1 to 2 days and purified to obtain N-alkyl-3,6-diformyl carbazole. The poly 3,6-N-alkyl carbazolyl cyanoterephthalidene was synthesized by reacting the N-alkyl-3,6-diformyl carbazole in the condition of 1,4-phenylene diacetonitrile and tetra(n-butyl) ammonium hydroxide/tetrahydrofuran/ethanol, precipitating in methanol, filtering and drying.

EXAMPLE 2

Carbazole and the alkyl halide 2-ethylhexyl bromide were refluxed for 8 hours in the presence of sodium hydride and dimethyl formamide. After reaction, the solution was poured into excess water, extracted with an organic solvent such as chloroform, dichloromethane or ethylacetate, and dried. The subsequent steps were carried out as described in EXAMPLE 1.

EXAMPLE 3

Carbazole and alkyl halides having various carbon numbers, e.g., 2-ethylhexyl bromide, were refluxed for 12 hours in the presence of sodium hydroxide and 1,4-dioxane/tetrahydrofuran. After reaction, the solution was poured into excess water, extracted with organic solvent such as chloroform, dichloromethane or ethylacetate, and dried. The subsequent steps were carried out as described in EXAMPLE 1.

EXAMPLE 4

N-alkyl carbazole was obtained by reacting carbazole with the alkyl halide 2-ethylhexyl bromide in the presence of sodium hydroxide and water (weight ratio=1:1) and benzyltrimethyl ammonium chloride as a phase transition catalyst in benzene at room temperature for 1 day. After reaction, the solution was poured into excess water, extracted with an organic solvent such as chloroform, dichloromethane or ethylacetate, and dried. The subsequent steps were carried out as described in EXAMPLE 1.

The poly 3,6-N-alkyl carbazolyl cyanoterephthalidenes synthesized in EXAMPLES 1 to 4 were each incorporated between the cathode of indium tin oxide (ITO) and the anode of aluminum, and the property of the emitting diode was measured by applying an electric field to the cathode and the anode.

Figure 1:
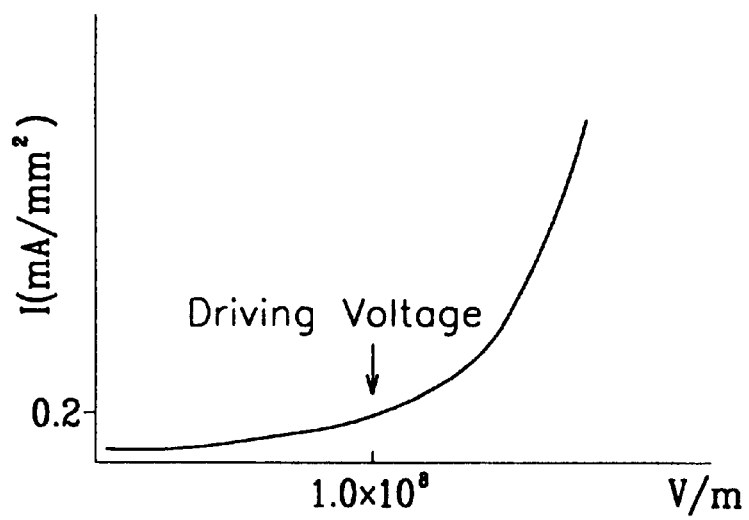
FIG. 1 is a graph illustrating current density change according to electric field intensity of a luminescent compound for an electroluminescence display device prepared in one of the examples of the present invention.
Figure 2:
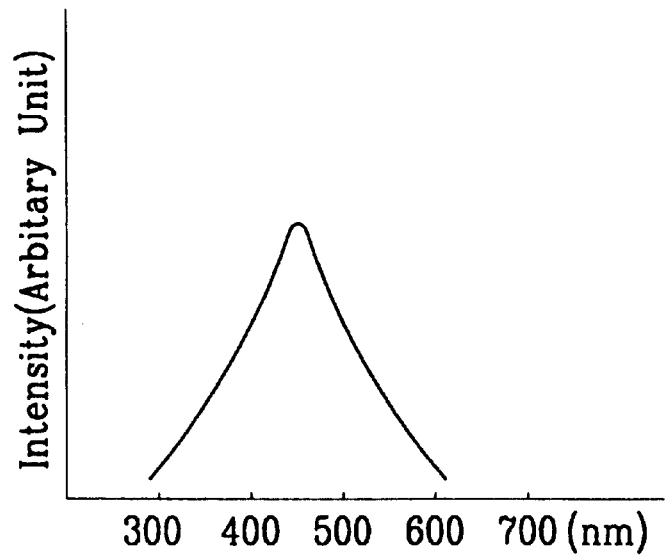
FIG. 2 is a luminescence spectrum of a luminescent compound for an electroluminescence display device prepared in one of the examples of the invention.

As shown in FIG. 1, the maximum wavelength of the luminescent color was 450 nm and, as shown in FIG. 2, the driving voltage was $1.0 \times 10^8$ V/m.

COMPARATIVE EXAMPLE

Poly p-phenylenevinylene as a luminescent compound was incorporated between the cathode of indium tin oxide (ITO) and the anode of aluminum, and the property of the emitting diode was measured by applying an electric field to the cathode and the anode. The maximum wavelengths were 525 nm, 550 nm and 600 nm, at which green color was emitted, and the driving voltage of $1.0 \times 10^8$ V/m at the similar brightness as in the above examples.

In addition, an ELD emitting blue color was prepared by controlling the energy difference in the ground and the excited state of the main chain of the conjugated polymer through the interaction of aromatic amine and cyano group by molecular weight.

What is claimed is:

1. A luminescent polymer for an electroluminescence display device (ELD) comprising:

a main polymer chain;

a component having an electron-donating group attached to the main polymer chain; and a component having an electron-accepting group attached to the main polymer chain, wherein the electron-donating group is an aromatic amine moiety and the electron accepting group is a cyano moiety and the aromatic amine moiety and cyano moiety are conjugated in the main polymer chain of the luminescent polymer.

2. The luminescent polymer for an ELD of claim 1 wherein the luminescent polymer for an ELD has the following chemical formula 1:

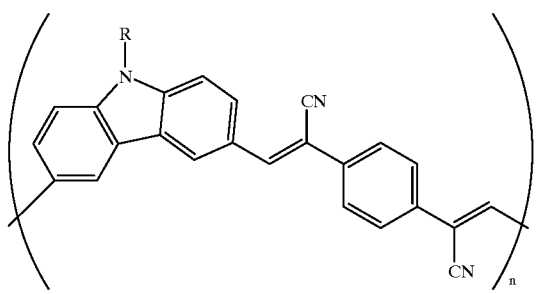

(1)

wherein, R is a $C_1$–$C_{24}$ alkyl group.

3. A method of producing poly 3,6-N-alkyl carbazolyl cyanoterephthalidene comprising the steps of:

producing N-alkylcarbazole;

producing N-alkyl-3,6-diformylcarbazole by reacting the N-alkylcarbazole with phosphorous oxychloride/dimethyl formamide/dichloroethane; and reacting the N-alkyl-3,6-diformylcarbazole with a solution system containing 1,4-phenylene diacetonitrile followed by alcohol precipitation, filtration and drying.

4. The method of producing poly 3,6-N-alkyl carbazolyl cyanoterephthalidene of claim 3, wherein the step of producing N-alkyl carbazole comprises refluxing potassium carbonate, dimethyl formamide, carbazole and alkyl halides for 1 to 2 days, where the alkyl halide is selected from the group consisting of halides of methane, ethane, propane, butane, pentane, hexane, heptane, octane, 2-ethyl hexane, nonane, decane, undecane, dodecane, tridecane, tetradecane, pentadecane, hexadecane, octadecane, docosane and tetracosane.

5. The method of producing poly 3,6-N-alkyl carbazolyl cyanoterephthalidene of claim 3, wherein the step of producing N-alkyl carbazole comprises refluxing carbazole and alkyl halides in the presence of sodium hydride and dimethyl formamide or 1,4-dioxane/tetrahydrofuran for 8 to 48 hours, where the alkyl halide is selected from the group consisting of halides of methane, ethane, propane, butane, pentane, hexane, heptane, octane, 2-ethyl hexane, nonane, decane, undecane, dodecane, tridecane, tetradecane, pentadecane, hexadecane, octadecane, docosane and tetracosane.

6. The method of producing poly 3,6-N-alkyl carbazolyl cyanoterephthalidene of claim 3, wherein the step of producing N-alkyl carbazole comprises refluxing carbazole and alkyl halides in the presence of sodium hydroxide or potassium hydroxide and 1,4-dioxane/tetrahydrofuran for 12 to 48 hours, where the alkyl halide is selected from the group consisting of halides of methane, ethane, propane, butane, pentane, hexane, heptane, octane, 2-ethyl hexane, nonane, decane, undecane, dodecane, tridecane, tetradecane, pentadecane, hexadecane, octadecane, docosane and tetracosane.

7. The method of producing poly 3,6-N-alkyl carbazolyl cyanoterephthalidene of claim 3, wherein the step of producing N-alkyl carbazole comprises mixing sodium hydroxide or potassium hydroxide and water wherein the weight ratio of sodium hydroxide or potassium hydroxide to water is 1:1, and refluxing carbazole and alkyl halides in the presence of a phase transition catalyst for 1 to 2 days, where the alkyl halide is selected from the group consisting of halides of methane, ethane, propane, butane, pentane, hexane, heptane, octane, 2-ethyl hexane, nonane, decane, undecane, dodecane, tridecane, tetradecane, pentadecane, hexadecane, octadecane, docosane and tetracosane.

8. The method of producing poly 3,6-N-alkyl carbazolyl cyanoterephthalidene of claim 3, wherein the solution containing 1,4-phenylene diacetonitrile is selected from the group consisting of tetra(n-butyl)ammonium hydroxide, 1,4-phenylene diacetonitrile/tetra(n-butyl)ammonium hydroxide/ethanol/tetrahydrofuran, 1,4-phenylene diacetonitrile/tetra(n-butyl)ammonium hydroxide/tetrahydrofuran, and potassium t-butoxide/tetrahydrofuran.

* * * * *